(12) United States Patent
Shen et al.

(10) Patent No.: US 8,927,877 B2
(45) Date of Patent: Jan. 6, 2015

(54) LOOPED INTERCONNECT STRUCTURE

(75) Inventors: Hsin-An Shen, Hsin-Chu (TW); Yung Ching Chen, Dali (TW); Ming-Chung Sung, Taichung (TW); Chih-Hang Tung, Hsin-Chu (TW); Chien-Hsun Lee, Chu-tung Town (TW); Da-Yuan Shih, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 167 days.

(21) Appl. No.: 13/570,089

(22) Filed: Aug. 8, 2012

(65) Prior Publication Data

US 2014/0041918 A1 Feb. 13, 2014

(51) Int. Cl.
*H05K 1/11* (2006.01)
*H05K 3/30* (2006.01)

(52) U.S. Cl.
USPC ............................ 174/261; 174/267; 29/842

(58) Field of Classification Search
CPC .................. H01L 23/49; H01L 23/42; H05K 2201/10287
USPC ............................ 174/261, 267; 29/842–845
See application file for complete search history.

(56) References Cited

U.S. PATENT DOCUMENTS 5,926,951 A * 7/1999 Khandros et al. ............... 29/843

OTHER PUBLICATIONS

Blaine Partee, Empfasis "Tech Tips . . . Wire bonding: Ball Bonding vs. Wedge Bonding", May 2005, National Electronics Manufacturing Center of Excellence.*

* cited by examiner

*Primary Examiner* — Jeremy C Norris
(74) *Attorney, Agent, or Firm* — Slater & Matsil, L.L.P.

(57) ABSTRACT

Disclosed herein is a system and method for mounting packages by forming one or more wire loop interconnects, optionally, with a wirebonder, and mounting the interconnects to a mounting pad on a first substrate. A first and second stud ball may each have at least one flat surface be disposed on a single mounting pad, and a wire having a bend region and forming a loop may be disposed between the stud balls. The stud balls may be formed from a deformed mouthing node formed on a wire. The loop may be mounted on a mounting pad on a first substrate and a second substrate may be mounted on the loop via a conductive material such as solder.

20 Claims, 9 Drawing Sheets

LOOPED INTERCONNECT STRUCTURE

BACKGROUND

Generally, one of the driving factors in the design of modern electronics is the amount of computing power and storage that can be shoehorned into a given space. The well-known Moore's law states that the number of transistors on a given device will roughly double every eighteen months. In order to compress more processing power into ever smaller packages, transistor sizes have been reduced to the point where the ability to further shrink transistor sizes has been limited by the physical properties of the materials and processes. Designers have attempted to overcome the limits of transistor size by packaging ever larger subsystems into one chip (systems on chip), or by reducing the distance between ships, and subsequent interconnect distance.

BRIEF DESCRIPTION OF THE DRAWINGS

For a more complete understanding of the present embodiments, and the techniques involved in making and using the same, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale.

DETAILED DESCRIPTION OF ILLUSTRATIVE EMBODIMENTS

Figure 1A:
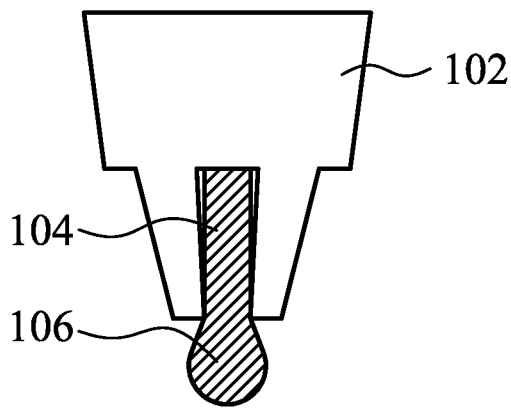
FIGS. 1A-1H are cross-sectional diagrams illustrating intermediate steps in an embodiment of a method for forming and applying a looped wire interconnect.

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely making and using looped wire interconnects useful in, for example, package-on-package assemblies. Other embodiments may also be applied, however, to other electrically connected components, including, but not limited to, mounting bare chips without packaging, mounting displays, mounting input components, board mounting, die or component mounting, or connection packaging or mounting of combinations of any type of integrated circuit or electrical component.

The presented disclosure is directed to providing a system and method for creating looped interconnects to separate, support and electrically connect one or more electrical components. Looped wire interconnect systems may provide a stronger connection than alternative methods of packaging, and reduce the failure rate of interconnected assemblies. The looped wire interconnects provide greater bonding to a mounting pad while providing stronger interconnections between packages with widely varying coefficients of thermal expansion. Looped wire interconnects may be used to attach, or stack multiple packages vertically, connecting the stacked packaged via redistribution layer (RDL) contacts, electrical traces, mounting pads or the like. In particular, using a bent or looped wire having two wire bonded stud balls on a single pad with the wire looped or bent and second substrate bonded to the bent wire loop provides increased bonding surface area and additional interconnect strength for wafer level chip scale packaging in, for example, die-to-PCB interconnections.

The looped wire interconnects may be referred to as looped wire, loops, bumps, wire interconnects or the like. The loops may be mounted between two substrates and be used as stand-offs for package-on-package (PoP) assemblies, where the loop supports a second substrate on a first substrate. Substrates may, for example, be component packages with one or more components mounted onto a carrier board. Alternatively, substrates may be dies, individual components, PCBs, or the like. While the embodiments of the looped wire interconnects are described herein as wire, in some embodiments, the loops are constructed of a deformable or pre-bent material that may be semi-rigid or otherwise capable of securely separating opposing substrates. Additionally, while the loops may be described as uniform, the loops need not be perfectly uniform, but are ideally substantially uniform in height, or at least substantially uniform across a desired plane. For example, loops may be mounted on a lower substrate, extending upward to accept or support an upper substrate mounted on the loops. The lower substrate may have mounting pads arranged in virtually any topography, however, forming the loops to a generally uniform height may permit mounting a second substrate such that each loop contacts a mounting pad of other connection point on the second substrate. Disparate groups of loops may also each be formed to a predetermined, substantially uniform height, so that substrates having a non-planar mounting pad topography, or multiple substrates mounted at different heights, may be advantageously mounted on the interconnects.

In particularly useful embodiments of the presented disclosure, a package on package assembly may be created, or a substrates may be mounted, using interconnects that may be created as loops and optionally be pre-formed, created with bulk material or created in place by extrusion or via wire from a wirebonder system. The interconnects may be optionally formed with one or two mounting nodes on the ends which may be created by, for example, an electric flame off process. The loops may be mounted to mounting pads on a first substrate, via ultrasonic welding, solder paste, solder, conductive adhesive, or the like.

In this manner, multiple interconnects may be formed and mounted, with groups of interconnects formed to one or more predetermined, substantially uniform heights.

During forming and mounting, a support plate may support the back side of the first substrate, particularly to minimize flexion or distortion of the first substrate when mounting the loops using a wirebonder or pressure inducing mounting technique such as ultrasonic welding. A mask may also be used to mask the loop mounting side of the first substrate. The mask may have openings permitting the formation and mounting of loops, and the mask may support and protect the first substrate during the loop processing steps.

With reference now to FIG. 1A, a first embodiment of method for forming and applying trimming a looped wire interconnect is depicted. A wire loop interconnect 118 may, in some embodiments, be formed from a wire 104 or another substantially solid and formable material. In some embodiments, a loop placement system 102 may be a wirebonder system, a pick-and-place system, or the like. In systems where a wirebonder 102 is used to form and mount the loop 118, the loop 118 may be formed from a continuous wire 104 so that the wirebonder 102 may form and mount loops 118 without reloading. When using a wirebonder 102 as the loop placement system, the wirebonder may extend some length of wire 104 and a mounting node 106 may be formed on the wire 104. One embodiment of the presented disclosure may be where an electric spark, or electric flame off, is applied to the end of the wire 104, to melt the tip of the wire 104 forming the mounting node 106. Such free air ball formation may be employed to form the mounting node 106 in situ, however the mounting node 106 may be formed using any suitable method, including pre-forming the loop 118 through extrusion, deposition, casting, milling or the like.

Figure 1B:
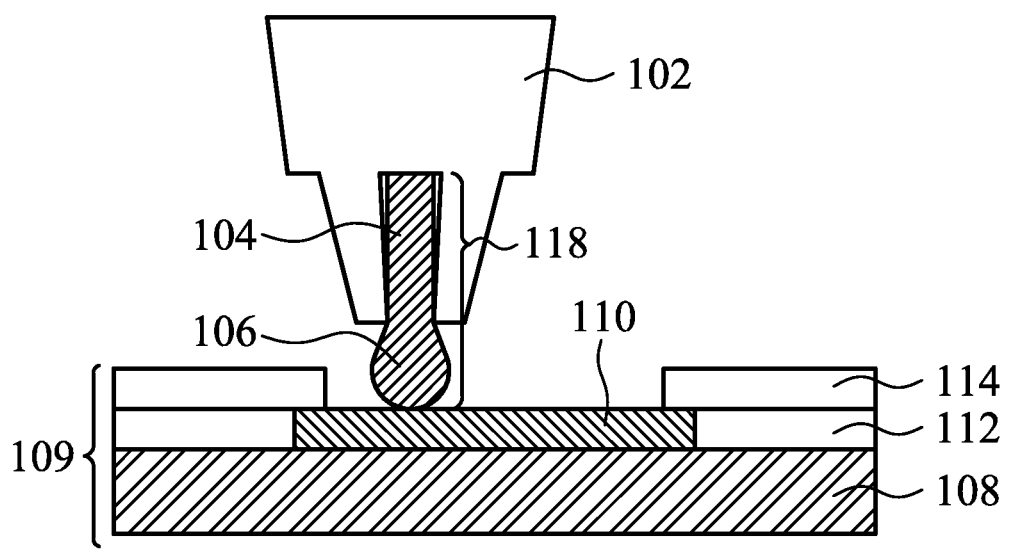

FIG. 1B illustrates application of the mounting node 106 to a mounting pad 110. A first substrate 109 may have a substrate 108 with one or more RDL layers applied thereon, and may include one or more mounting pads 110 separated by insulating layers 112 or covered with an oxide or passivation layer 114, or the like. The loop 118 may be attached to the mounting pad 110 through any suitable system, including, but not limited to, ultrasonic welding, soldering, arc welding, adhesives, solder paste and solder ball reflow or the like. In a deformation type attachment system such as ultrasonic welding, the loop placement system 102 may be used to apply pressure and ultrasonic or electrical energy to attach the loop 118 to the mounting pad 110. The mounting pad 110, may in one embodiment, be aluminum, but in other embodiments, may be copper, gold, nickel, palladium, alloys of the same or another conductive material. The wire 104 and resulting wire loop 118, may, in one embodiment, be copper, but may be aluminum, gold, nickel, palladium, alloys of the same, or another suitably deformable conductive material.

Figure 1C:
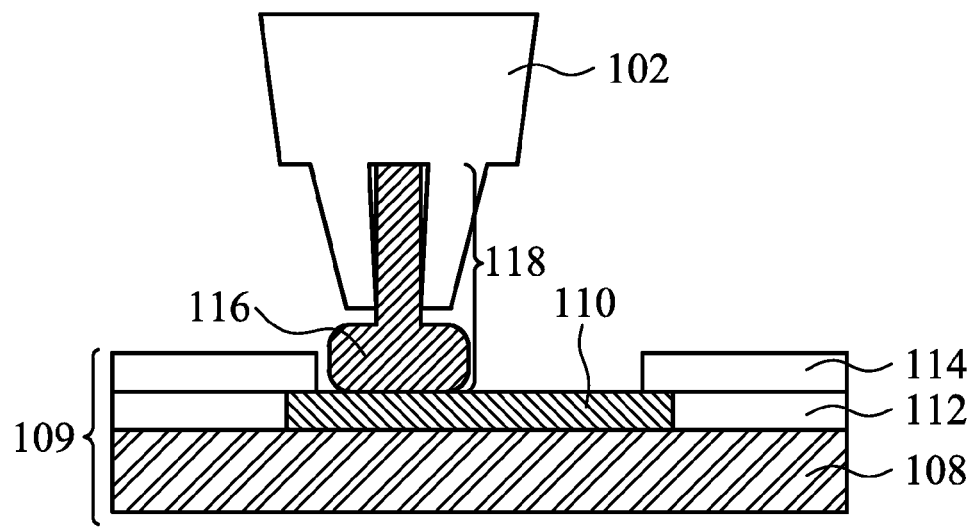

FIG. 1C illustrates a loop 118 attached to the mounting pad 110, with the mounting node 106 generally flattened or deformed to form a first mounting ball or first stud ball 116, and more completely bond with the mounting pad 110. In particular, ultrasonic welding or the like may be used in combination with pressure from the interconnect placement system 102 to deform the mounting node 106 to create the first stud ball 116 from the mounting node 106, and to increase the area of contact between the mounting pad 110 and the first stud ball 116. Alternatively, a pre-formed loop 118 may be provided, and that pre-formed loop 118 may have a sufficiently broadened mounting node 106 such that pressure causing deformation during mounting may not be required.

Figure 1D:
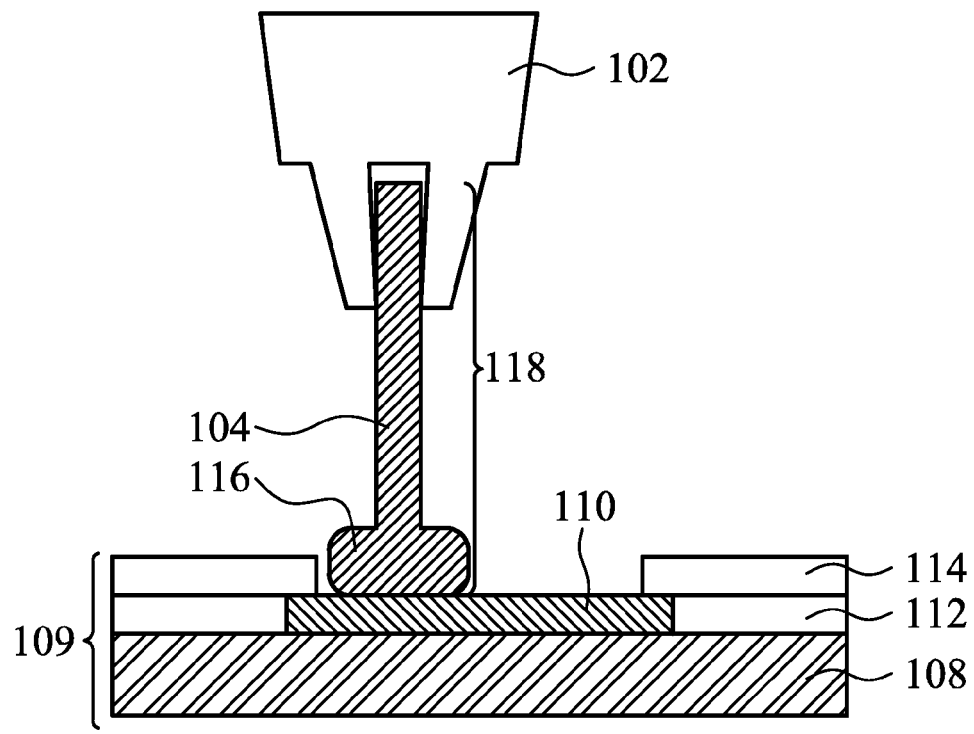

FIG. 1D illustrates a loop 118 cut to length for second stud ball creation and bonding. In an embodiment where the interconnect placement system 102 is a wirebonder, the wirebonder 102 may act as the supporting system, and the wirebonding head 102 may trim the wire 104 or material used to form the loop 118 to a predetermined length. In one embodiment, a desired loop 118 height may be determined prior to loop 118 formation, and the loop 118 wire 104 may be trimmed so that after the stud balls 116, 130 (described below with respect to FIG. 1G) and loop 118 are formed, the loop 118 has a predetermined height. Alternatively, a wirebonder 102 may cut the loop 118 wire 104 to rough size, and then a separate trimming system may trim the loop 118 wire 104 to a final length. Such a separate trimming system may advantageously employ a laser, trimming wire, blade, saw, or any other system useful for accurately trimming a loop 118 wire 104.

Skilled practitioners will recognize that formation of stud balls 116, 130 will effectively shorten the useful length of the loop 118 due to additional wire 104 material being required to thicken the wire 104 and form stud balls 116, 130 with a diameter greater than the original wire 104 diameter.

Figure 1E:
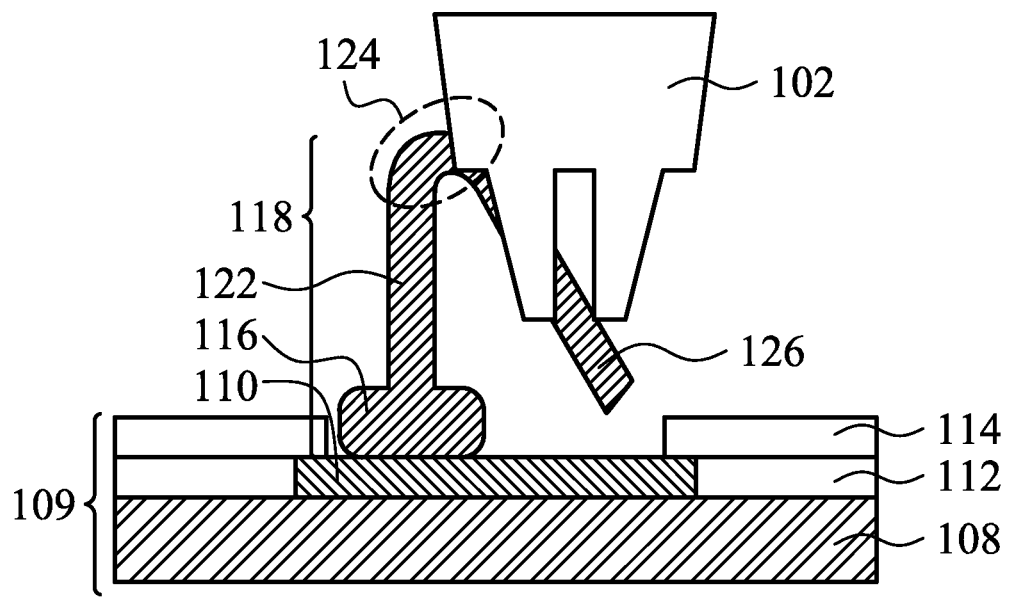

FIG. 1E illustrates forming a bend region 124 in the loop 118. In some embodiments, the wirebonder 102 head 102 may be used to bend the loop 118 and form a first leg 122 separated from the second leg 126 by the bend region 124. In another embodiment, the loop 118 may be bent over a die by the wirebonder 102 to more accurately form the bend region 124.

Figure 1F:
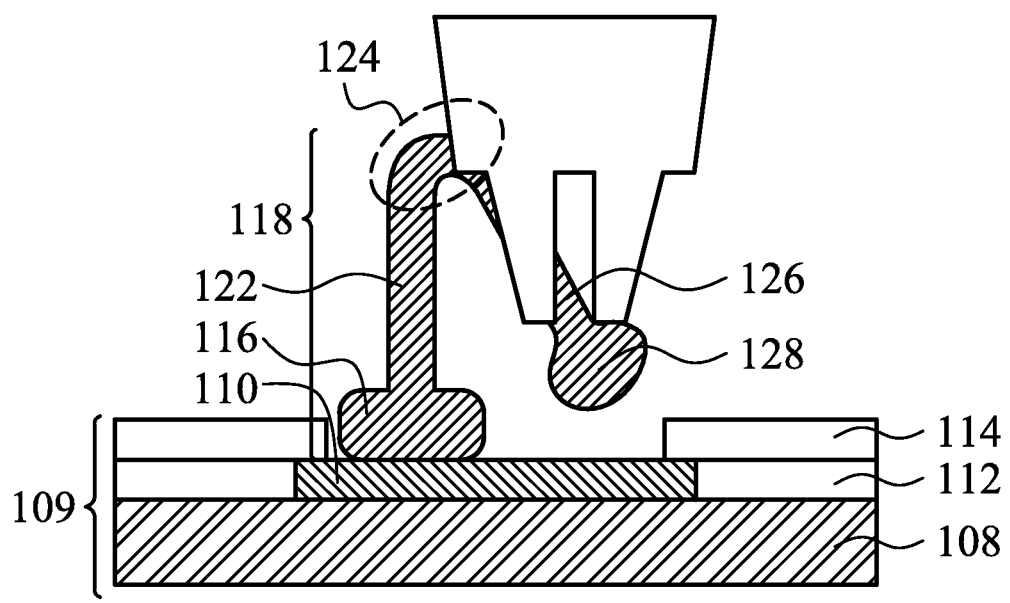

FIG. 1F illustrates formation of a second mounting node 128 on the loop 118. A second stud ball may be formed directly on the loop 118 by, for example, an electric flame off process similar to that used to form the initial mounting node 106. While the second mounting node 128 is shown herein as being formed on the partially bent loop 118, the second mounting node may alternatively be formed prior to bending the loop 118. In another embodiment, the second mounting node 128 may be formed by a device separate from the wirebonder 102.

Figure 1G:
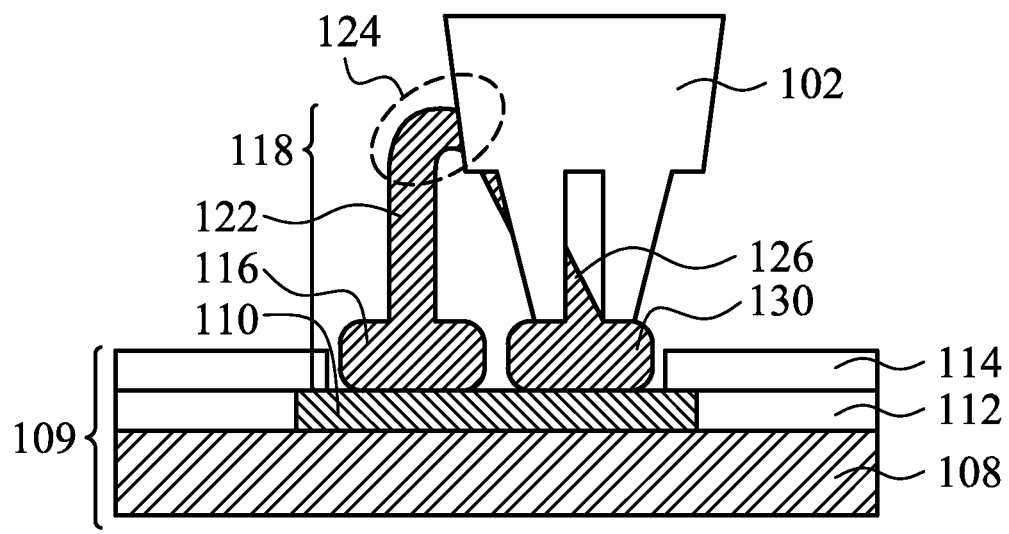

FIG. 1G illustrates mounting of the second leg 126 of the loop 118. The second mounting node 106 may have the mounting node material generally flattened or deformed to form the second stud ball 130 resulting in with a greater surface area and bond strength than a wedge bond, where the loop 118, or wire, would be bonded on its side to the mounting pad 110. As with the first stud ball 116, the second stud ball 130 may be formed by deformation of the second mounting node 128 via a combination pressure from the wirebonder 102 and ultrasonic welding.

Figure 1H:
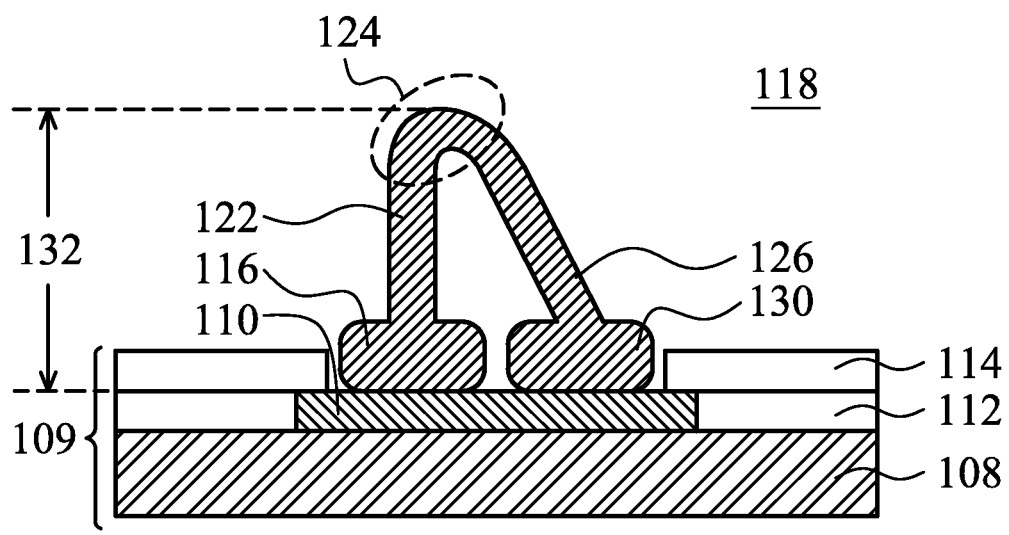

FIG. 1H illustrates a mounted wire loop interconnect 118. The first stud ball 116 and second stud ball 130 may both be bonded to a single mounting pad 110. Additionally, the first stud ball 116 and second stud ball 130 may be joined by the first leg 122 and second leg 126 of the loop, with legs 122, 126 separated by a bend region 124. In the illustrated embodiment, the legs 122, 126 are both substantially straight, and the first leg 122 is substantially perpendicular to a plane formed by the stud balls 116, 130, and the second leg 126 is angled towards the first leg 122. In one embodiment, the first stud ball 116 and the second stud ball 130 may each have at least one substantially flat surface configured to be attached to a single mounting pad 110.

The wire loop interconnect 118 may, in some embodiments, be varied to achieved a predetermined loop height 132 and desired package separation. For example, some embodiments of the loops 118 may have a loop height 132 between about 50 µm and about 200 µm. Additionally, the width 134 of the mounting pad 110 exposed portion may be varied based on the bond pitch or to accommodate loops 118 having varied size stud balls 116, 130. The mounting pad 110 may be larger than the exposed portion of the mounting pad 110, with the passivation layer 114 covering a portion of the mounting pad 110. In some embodiments, the width 134 of the mounting pad 110 exposed portion may be between about 65 µm to about 400 µm wide.

Figure 2A:
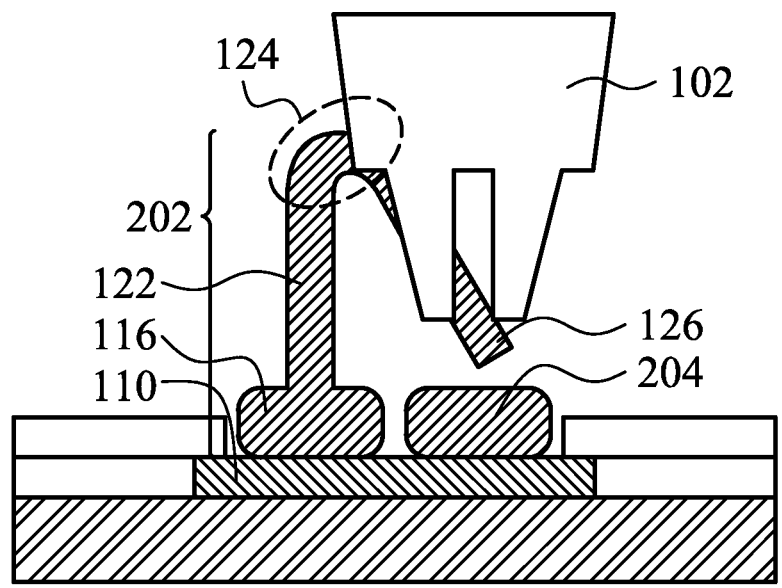
FIGS. 2A-2B are cross-sectional diagrams illustrating another embodiment of a method for forming and applying a looped wire interconnect.

FIG. 2A illustrates application of a partial loop 202 to a separate second stud ball 204. In such an embodiment, a separate stud ball 204 may be applied to the mounting pad 110 prior to the partial loop 202 being applied the separate stud ball 204. In one embodiment, the wirebonder 102 may trim and release the partial loop 202 and may separately place the separate stud ball 204. Alternatively, a second wirebonder, or another device, may place the separate stud ball 204.

Figure 2B:
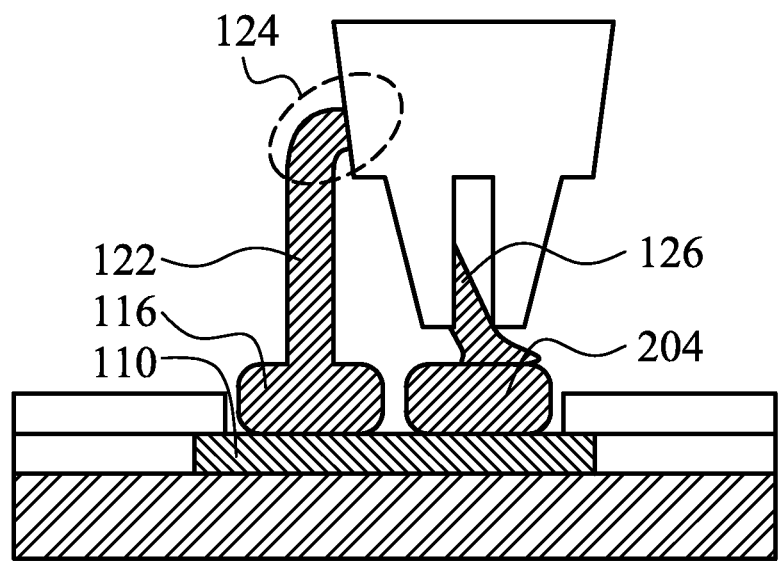

FIG. 2B illustrates a completed loop constructed with a separate stud ball 204. The second leg of the partial lop 202 may be bonded, via ultrasonic welding, soldering, or the like to the separate stud ball 204. In such an embodiment, the second leg of the partial loop 202 may be deformed against the top surface of the second separate stud ball to complete the loop 202.

Figure 3A:
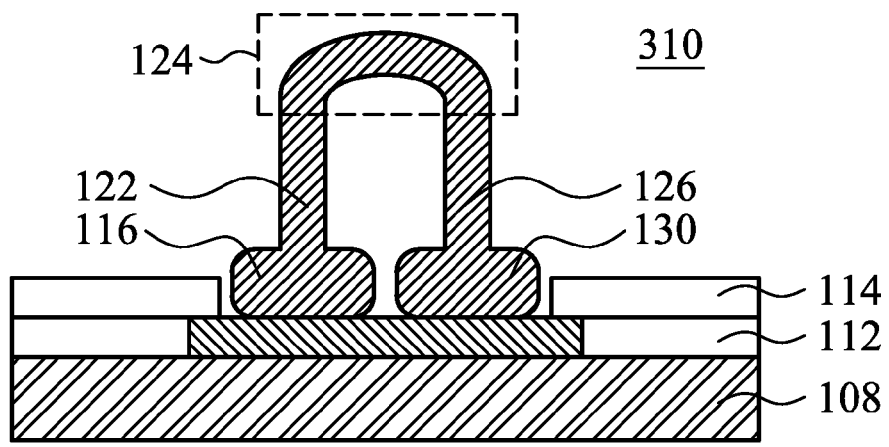
FIGS. 3A-3C are cross-sectional diagrams illustrating embodiments of a looped wire interconnect.

FIG. 3A illustrates an embodiment of a semicircular wire loop interconnect 310. In the illustrated embodiment, the semicircular loop 310 has a substantially vertical first leg 122 and a substantially vertical second leg 126, with the legs 122, 126 substantially straight and substantially parallel to each other. The legs 122, 126 are connected by a semicircular bend region 124, with the width of the bend region 124 about the same as the separation between the legs at the first stud ball 116 and the second stud ball 130.

Figure 3B:
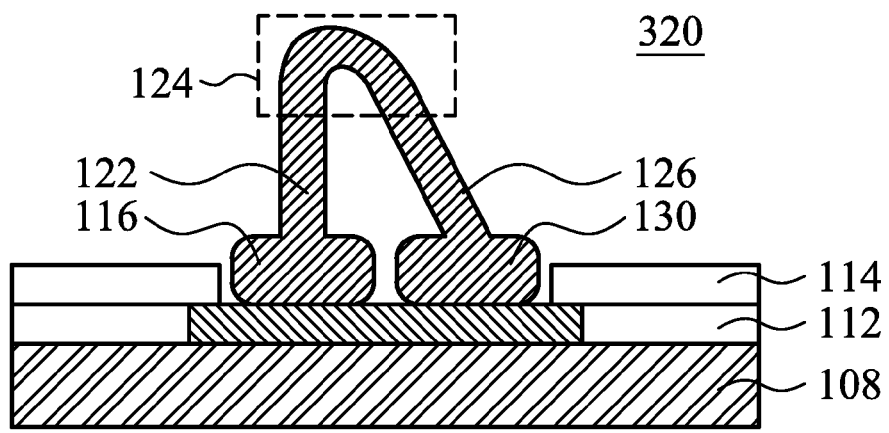

FIG. 3B illustrates an embodiment of a triangular wire loop interconnect 320. In the illustrated embodiment, the triangular loop 320 has a first leg 122 and second leg 126 that are substantially straight and angled toward each other. The legs 122, 126 are connected by a bend region 124 disposed between the first stud ball 116 and the second stud ball 130.

Figure 3C:
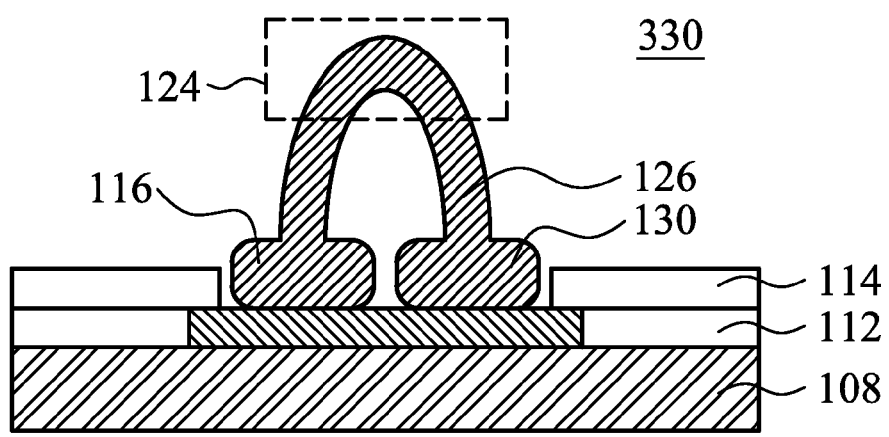

FIG. 3C illustrates an embodiment of an arched wire loop interconnect 330. In the illustrated embodiment, the semicircular loop 310 has a curved first leg 122 and a curved second leg 126 and the legs 122, 126 curve toward each other. The legs 122, 126 are connected by a curved bend region 124.

Figure 4A:
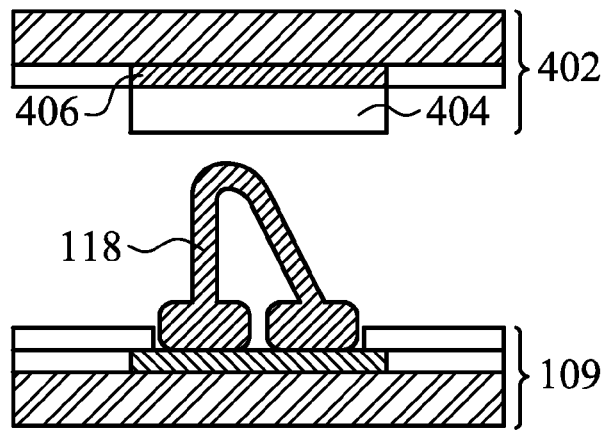
FIGS. 4A-4C are cross-sectional diagrams illustrating embodiments of methods for mounting a second substrate to a looped wire interconnect.

FIG. 4A illustrates an initial step in mounting a second substrate 402 to a loop 118. A second substrate 402 having a chip, die, RDL layer or the like may have a top mounting pad 406, land, or the like. A conductive material pad 404 may be applied to the top mounting pad 406. The conductive material pad 404 is illustrated in this particular embodiment as a solder pad. The conductive material pad 404 may also, in other embodiments, be formed from solder paste, a conductive adhesive or the like. The loop 118, mounted on a first substrate 109, may be aligned with the conductive material pad 404 prior to the second substrate 402 being brought into contact with the loop 118.

Figure 4B:
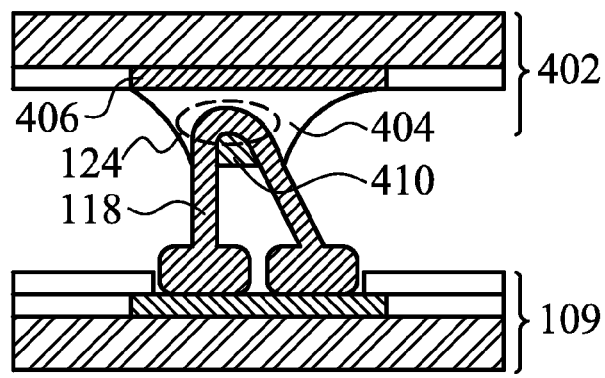

FIG. 4B illustrates a second substrate 402 mounted to a loop 118. The conductive material pad 404 of the second substrate 402 is brought into contact with the loop 118. In embodiments where a solder pad is used, the solder may be heated or reflowed to cause the solder of the conductive material pad 404 to adhere to the loop 118. In one embodiment, sufficient solder will be used so that a solder bridge 410 is created through the opening in the loop 118. The solder may be reflowed so that solder is disposed surrounding all of, or at least a portion of, the bend region, strengthening the connection between the solder and the loop 118. Thus, a first substrate 109 having a mounting pad 110 may be electrically connected to a second substrate 402 having a second substrate mounting pad 406 via a wire mounting loop 118.

Figure 4C:
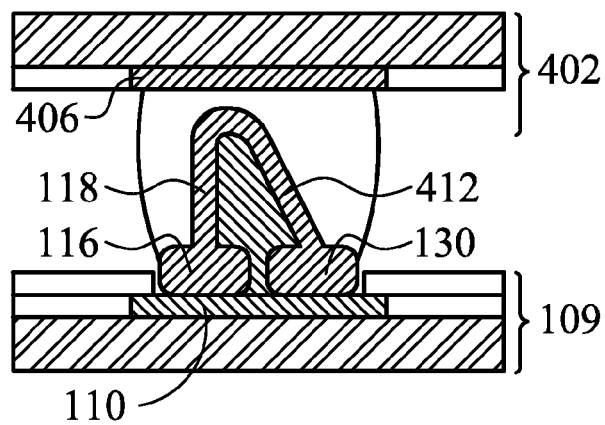

FIG. 4C illustrates an alternative embodiment of a second substrate 402 mounted to a first substrate 109. In such an embodiment, a conductive material 412, illustrated herein as a solder ball, may be applied to the top mounting pad 406, and solder may surround the loop 118, to contact the mounting pad 110. In another embodiment, the conductive material 412 may contact the first stud ball 116 or the second stud ball 130, spanning from the first substrate 109 mounting pad 110 to the top mounting pad 406.

Figure 5:
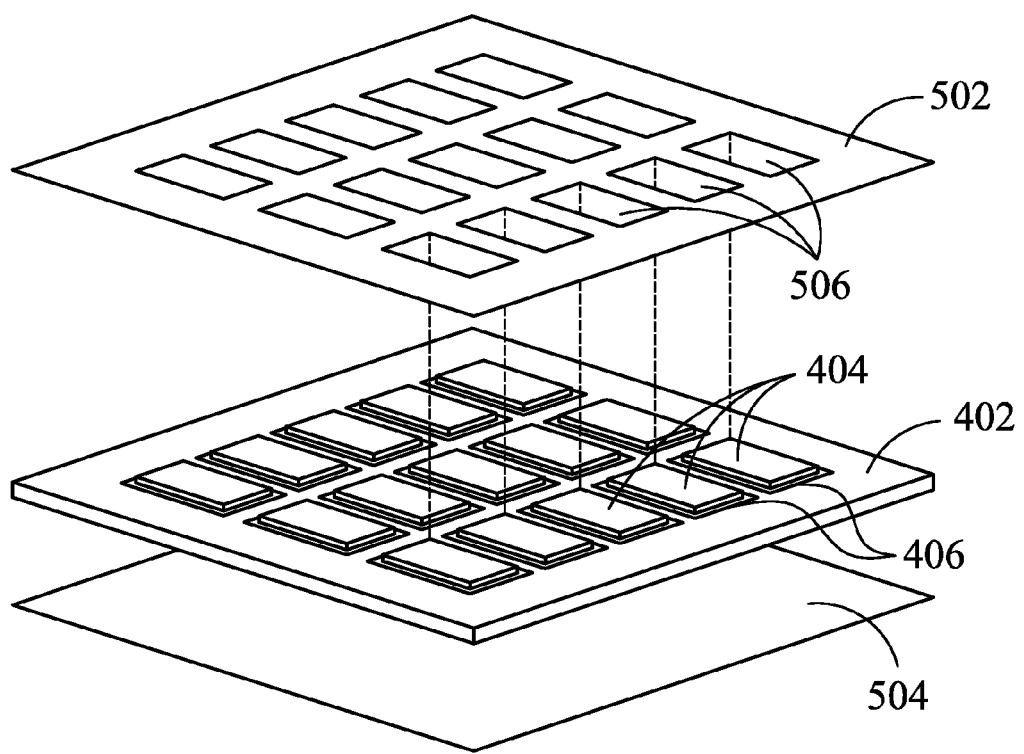
FIG. 5 is a diagram illustrating an embodiment of a method of masking and applying a looped wire interconnect.

FIG. 5 illustrates a mask 502 and support plate 504 that may, in one embodiment, be used when applying conductive material pads 404. The mask 502 may be placed on the second substrate 109, which is illustrated upside-down in FIG. 5 for clarity. The mask 502 may have one or more openings 506 through which the top mounting pads 406 are exposed. Conductive material, such as a solder paste, conductive epoxy, or the like may be applied over the mask, with conductive material adhering to the top mounting pads 406 through the openings 506 in the mask 502. Additionally, a support plate 504 may be used to support or resist flex in the second substrate 402 when the conductive material pads 404 are applied.

Figure 6:
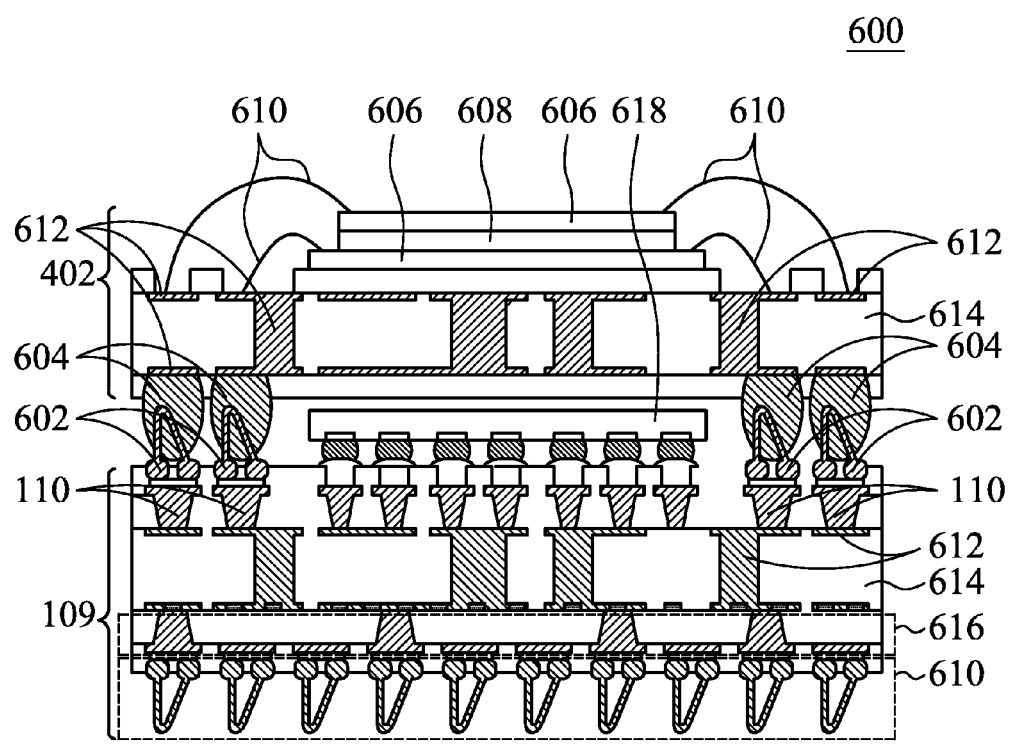
FIG. 6 is a cross-sectional diagram of an embodiment of looped wire interconnects mounted in a package-on-package device.

FIG. 6 illustrates a package-on-package (PoP) device 600 employing package mounting loops 602 as mounting devices. One or more second substrate dies 606 may be mounted on a second substrate 402 via an adhesive 608 or the like. For example, in one embodiment, the second substrate 402 may have a processor and separate memory die attached to the top surface, and those dies 606 may be electrically connected via wire bonds 610 to vias 612 in a substrate layer 614, by for example mounting pads or a second RDL layer 616. The substrate layer 614 may, in some embodiments, be an RDL layer, a metallization layer or the like, with the vias 612 being metallization lines or vias or other conductive elements.

A first substrate 109 may have one or more package mounting loops 602 disposed on mounting pads 110 in the first substrate 109. A conductive attachment system 604, such as solder balls may be used to attach the second substrate 402 to the package mounting loops 602. Additionally, the first substrate 109 may have a first substrate die 618 disposed on a surface and electrically connected to vias 612 in a substrate layer 614 in the first substrate 109. The first substrate die 618, may be a processor, memory, or other chip device or package. In the first substrate, the substrate layer 614 may be an RDL layer, a metallization layer or the like, with the vias 612 being metallization lines or vias or other conductive elements.

The first substrate 109 may also have PoP mounting loops 610 disposed on the first substrate opposite the package mounting loops 602. The PoP mounting loops 610 may be configured to mount the overall PoP package 600 to another a third substrate, board, die, casing, display, input device, or the like. The PoP mounting loops 610 maybe formed to the same height as then package mounting loops 602, or may be formed to a different height.

The vias 612 may act as a redistribution layer in the first substrate 109 and second substrate 402, permitting connected elements to be in electrical connection or communication with other connected elements. For example, the second substrate 402 may have a memory die and a graphics processor as second substrate dies 606, and those may be wire bonded 610 to the vias 612 in the substrate layer 614 of the second substrate 402. The substrate layer 614 and vias 612 may act as an RDL to connect one or more pins or pads of the second substrate dies to each other 606, or to the conductive attachment system 604 and package mounting loops 602. The package mounting loops 602 may, in turn, be electrically connected to the vias 612 and substrate layer 614 of the first package 109. The PoP mounting loops 610 and first substrate die 618 may be connected to the first substrate 109 vias 612 and substrate layer 614 as well. Thus, in one embodiment, the second substrate dies 606, may be in electric communication with the first substrate die 618 and, optionally, one or more PoP mounting loops 610. Similarly, the first substrate die 618 may be in electrical communication with one or more of the PoP mounting loops 610.

Although the present embodiments and their advantages have been described in detail, it should be understood that various changes, substitutions and alterations can be made herein without departing from the spirit and scope of the disclosure as defined by the appended claims. It will be readily understood by those skilled in the art that many of the features and functions discussed above can be implemented using a variety of materials and orders to the processing steps. For example, interconnects may be virtually any shape, as long as they are rigid or otherwise capable of securely separating opposing packages. Interconnects may also be any conductive material, or even a semiconductor material where such material is called for. As another example, it will be readily understood by those skilled in the art that many of the steps for creating a package-on-package structure may be performed in any advantageous order while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, apparatuses, manufacture, compositions of matter, means, methods, or steps.

What is claimed is:

1. A device comprising:
    a mounting pad disposed over a substrate;
    a protective layer disposed over the mounting pad and having an opening exposing a portion of the mounting pad, wherein the protective layer comprises a dielectric material;
    a wire comprising a first end and a second end;
    a first stud ball disposed at the first end of the wire and attached to the mounting pad; and
    a second stud ball disposed at the second end of the wire and attached to the mounting pad;
    wherein the wire extends through the opening in the protective layer and above an uppermost surface of the protective layer.

2. The device of claim 1, wherein the wire further comprises a bend region, the device having a height between about 50 µm and about 200 µm.

3. The device of claim 2, wherein the wire further comprises a first leg at the first end of the wire and attached to the first stud ball and a second leg at the second end of the wire and attached to the second stud ball, the first leg and second leg separated by the bend region.

4. The device of claim 1, wherein the first stud ball and second stud ball are mounted to an exposed portion of a single mounting pad on a first substrate, the exposed portion of the single mounting pad having a width between about 65 µm and 400 µm, and wherein a second substrate is mounted to the wire with a conductive material.

5. The device of claim 4, wherein the mounting pad is one of aluminum, copper, gold, nickel, palladium, and alloys thereof.

6. The device of claim 4, wherein the first and second stud balls are one of copper, aluminum, gold, nickel, palladium and alloys thereof.

7. The device of claim 4, wherein the conductive material is in contact with at least one of the first stud ball and the second stud ball.

8. A package comprising:
    a first wire loop comprising:
        a wire having a first end and a second end;
        a first stud ball at the first end;
        a second stud ball the second end; and
        a bend region disposed in the wire and separating the first and second stud balls;
    a first substrate having a first mounting pad, the first substrate further having and a first die, and the first wire loop mounted to a first surface of the first mounting pad via the first and second stud balls, and wherein the first surface of the first mounting pad is substantially planar between the first stud ball and the second stud ball; and
    a second substrate having a second mounting pad, the second substrate mounted to at least the bend region of the first wire loop by a conductive material disposed between the first wire loop and the second mounting pad of the second substrate.

9. The device of claim 8, wherein the second substrate has a second die disposed thereon, the second die electrically connected to the first die.

10. The device of claim 9, further comprising a second wire loop disposed on the first substrate and configured to mount the device to a third substrate.

11. The device of claim 10, wherein the first wire loop is disposed on a first surface of the first substrate, wherein the first die is disposed on the first surface of the first substrate and second wire loop is disposed on a second surface of the first substrate opposite the first surface of the first substrate.

12. The device of claim 11, wherein the second substrate has a second die disposed thereon, the second die electrically connected to the first die, and the second wire loop in electrical connected to one of the first die and the second die.

13. A method of forming an interconnect, comprising:
    forming a first mounting node on a first end of a wire;
    bonding the first mounting node to first surface of a mounting pad, the bonding forming a first stud ball from the first mounting node;
    forming a bend in the wire;
    cutting the wire to a predetermined length and creating a second end of the wire; and
    bonding the second end of the wire to the first surface of the mounting pad, the bonding forming a second stud ball at the second end of the wire;
    wherein a protective layer extends over the first surface of the mounting pad;
    wherein the protective layer has an opening exposing a first pad portion of the first surface of the mounting pad; and
    wherein the first stud ball and the second stud ball are disposed in the opening.

14. The method of claim 13, further comprising forming a second mounting node at the second end of the wire.

15. The method of claim 14, wherein providing a second stud ball comprises forming the second stud ball from the second mounting node.

16. The method of claim 15, wherein forming the first stud ball comprises applying the first mounting node to a mounting pad on a first substrate and forming the second stud ball comprises applying the second mounting node to the mounting pad on the first substrate.

17. The method of claim 16, further comprising electrically connecting a second substrate to the interconnect by applying conductive material between at least the bend region of the wire and a mounting pad on the second substrate.

18. The method of claim 17, wherein the conductive material is solder.

19. The method of claim 18, wherein forming the first stud ball comprises applying the first mounting node to a land on a first substrate and providing the second stud ball comprises applying the stud ball to the land on the first substrate and attaching the second end of the wire to the second stud ball.

20. The method of claim 19, further comprising forming the interconnect with a wirebonding system.

* * * * *